(12) United States Patent
Lim et al.

(10) Patent No.: US 9,180,715 B2
(45) Date of Patent: Nov. 10, 2015

(54) DONOR FILM AND THERMAL IMAGING METHOD USING THE SAME

(71) Applicant: SAMSUNG DISPLAY CO., LTD., Yongin, Gyeonggi-Do (KR)

(72) Inventors: Hyung-Tag Lim, Yongin (KR); Young-Gil Kwon, Yongin (KR); Sok-Won Noh, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/138,191

(22) Filed: Dec. 23, 2013

(65) Prior Publication Data
US 2015/0004543 A1 Jan. 1, 2015

(30) Foreign Application Priority Data

Jul. 1, 2013 (KR) .................. 10-2013-0076623

(51) Int. Cl.
| | | |
|---|---|---|
| *G03C 7/25* | (2006.01) | |
| *B41M 5/46* | (2006.01) | |
| *G03F 7/004* | (2006.01) | |
| *H01L 51/00* | (2006.01) | |
| *G03F 7/20* | (2006.01) | |
| *B41M 5/382* | (2006.01) | |

(52) U.S. Cl.
CPC .. *B41M 5/46* (2013.01); *G03C 7/25* (2013.01); *G03F 7/004* (2013.01); *G03F 7/20* (2013.01); *H01L 51/0013* (2013.01); *B41M 5/38214* (2013.01); *B41M 5/465* (2013.01)

(58) Field of Classification Search
CPC ............ G03F 7/004; G03F 7/25; G03F 7/20; B42M 5/38214; B42M 5/46; B42M 5/465; B42M 5/392; H01L 51/0013; G03C 7/25
USPC .......................................... 430/199, 200, 394
See application file for complete search history.

(56) References Cited

U.S. PATENT DOCUMENTS

| | | | |
|---|---|---|---|
| 2006/0188825 A1* | 8/2006 | Kang et al. ..................... | 430/322 |
| 2007/0082288 A1* | 4/2007 | Wright et al. ................. | 430/200 |
| 2008/0241733 A1* | 10/2008 | Wright et al. ................. | 430/200 |
| 2012/0231228 A1* | 9/2012 | Fujimori et al. .............. | 428/172 |
| 2013/0005211 A1* | 1/2013 | Shin et al. ........................ | 445/24 |

FOREIGN PATENT DOCUMENTS

| | | | |
|---|---|---|---|
| KR | 10 2006-0017415 A | 2/2006 | |
| KR | 10 2011-0040244 A | 4/2011 | |
| KR | 10 2011-0132021 A | 12/2011 | |
| KR | 10 2012-0053660 A | 5/2012 | |

* cited by examiner

Primary Examiner — Amanda C Walke
(74) Attorney, Agent, or Firm — Lee & Morse, P.C.

(57) ABSTRACT

A donor film and a thermal imaging method, the film including a base layer; a first light-to-heat conversion layer on the base layer; and a second light-to-heat conversion layer on the first light-to-heat conversion layer and to which an organic material is deposited, wherein the first light-to-heat conversion layer and the second light-to-heat conversion layer respectively absorb light of different wavelengths.

7 Claims, 7 Drawing Sheets

Area 1

DONOR FILM AND THERMAL IMAGING METHOD USING THE SAME

CROSS-REFERENCE TO RELATED APPLICATION

Korean Patent Application No. 10-2013-0076623, filed on Jul. 1, 2013, in the Korean Intellectual Property Office, and entitled: "Donor Film and Thermal Imaging Method Using the Same," is incorporated by reference herein in its entirety.

BACKGROUND

1. Field

Embodiments relate to a donor film and a thermal imaging method using the same.

2. Description of the Related Art

A thermal imaging process using laser beams may include a laser induced thermal imaging (LITI) method or a hybrid patterning system (HPS). For example, the thermal imaging process using laser beams may include techniques using thermal imaging components for imaging or transferring an organic material or an inorganic material to another member or substrate by using a donor film, that is a thermal imaging donor component.

The above information disclosed in this Background section is only for enhancement of understanding of the background of the invention and therefore it may contain information that does not form the prior art that is already known in this country to a person of ordinary skill in the art.

SUMMARY

Embodiments are directed to a donor film and a thermal imaging method using the same.

The embodiments may be realized by providing a donor film including a base layer; a first light-to-heat conversion layer on the base layer; and a second light-to-heat conversion layer on the first light-to-heat conversion layer and to which an organic material is deposited, wherein the first light-to-heat conversion layer and the second light-to-heat conversion layer respectively absorb light of different wavelengths.

The base layer may be made of a transparent polymer film or a glass substrate.

The first light-to-heat conversion layer may be coated on the base layer, and the second light-to-heat conversion layer may be coated on the first light-to-heat conversion layer.

The first light-to-heat conversion layer may absorb light having a shorter wavelength than light absorbed by the second light-to-heat conversion layer.

The first light-to-heat conversion layer and the second light-to-heat conversion layer may each independently include at least one of carbon black, carbon nanotubes (CNT), a metal oxide, or a metal sulfide.

The embodiments may also be realized by providing a thermal imaging method, the method including providing the donor film according to an embodiment; heating the second light-to-heat conversion layer by irradiating light of a wavelength that transmits through the first light-to-heat conversion layer and that is absorbed by the second light-to-heat conversion layer; heating the first light-to-heat conversion layer by irradiating light of a wavelength that is absorbed by the first light-to-heat conversion layer; and thermally imaging an organic material of the second light-to-heat conversion layer to an imaging substrate by thermal expansion when the first light-to-heat conversion layer is heated.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

A configuration of a donor film 20 according to an exemplary embodiment will now be described with reference to accompanying drawings.

Figure 1:
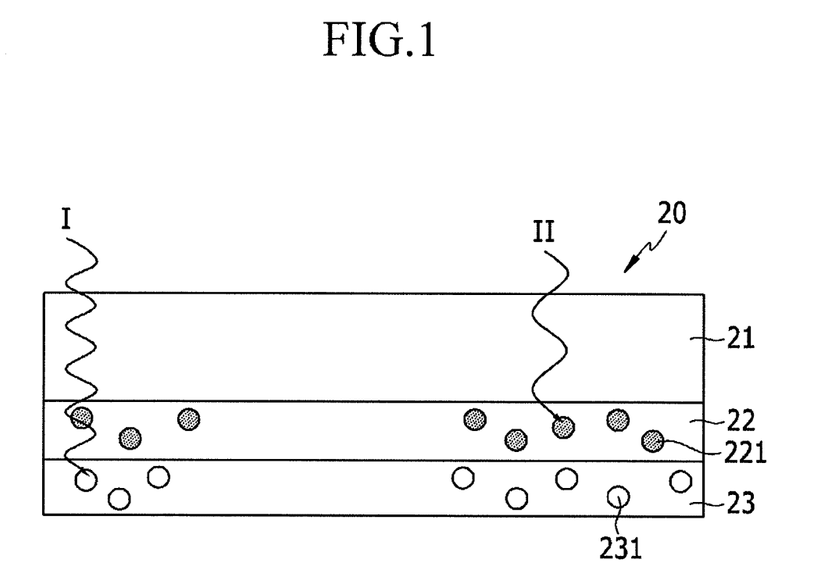
FIG. 1 illustrates a cross-sectional view of a donor film according to an exemplary embodiment.
Figure 2:
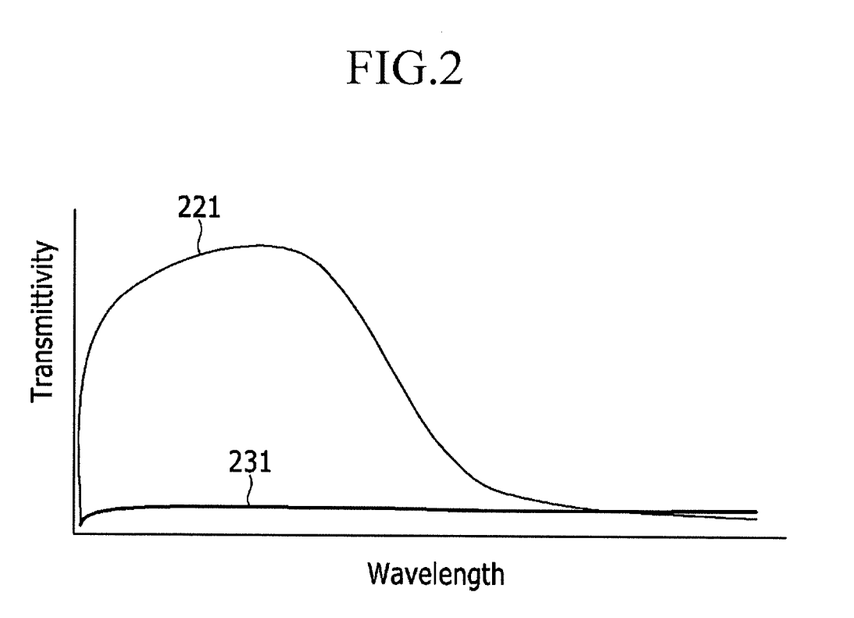
FIG. 2 illustrates a graph showing an amount of first and second laser beams with different wavelengths irradiated to the donor film of FIG. 1 that is transmitted through first and second light-to-heat conversion layers.

FIG. 1 illustrates a cross-sectional view of a donor film 20 according to an exemplary embodiment. FIG. 2 illustrates a graph showing an amount of first and second laser beams (with light of different wavelengths) irradiated to a donor film 20 of FIG. 1 that is transmitted through first and second light-to-heat conversion materials 221 and 231.

Other donor films may include an interlayer on a base layer, and a light-to-heat conversion layer. According to an embodiment, instead of including the interlayer, another light-to-heat conversion layer (that absorbs light, e.g., from laser beams, with a wavelength that is different from the wavelength of light absorbed by the light-to-heat conversion layer) may be included. Accordingly, the drawback of including the interlayer may be reduced. For example, generation of defects in the case of softening may be reduced, thereby allowing easy processing of the donor film as a roll and improving imaging width.

In an implementation, the donor film according to the exemplary embodiment may be realized by including a light-to-heat conversion material (that absorbs light, e.g., from laser beams, with a wavelength that is different from the light-to-heat conversion layer) into an interlayer, rather than replacing the interlayer with the other light-to-heat conversion layer.

Referring to FIG. 1, the donor film 20 according to an embodiment may include the base layer 21, the first light-to-heat conversion layer 22, and the second light-to-heat conversion layer 23.

The base layer 21 may function as a mechanical supporter at a lowest or outermost layer of the donor film 20. The base layer 21 may have sufficient mechanical stability, and it may have transparency and an appropriate optical property so as to transmit light to the first and second light-to-heat conversion layers 22 and 23.

The base layer 21 is shown in FIG. 1 at the top of the donor film 20, which is to visualize irradiation of laser beams to be described. However, in the actual donor film 20, the base layer 21 may be provided as any outermost layer, e.g., as the lowest layer.

The base layer 21 may be formed of a transparent polymer film or a glass substrate.

In an implementation, the polymer material may include at least one of a polyester, a polyacryl, a polyepoxy, polyethylene, or polystyrene. For example, the polymer material may be a material with high transmittance such as a polyethylene terephthalate (PET) or polyethylene naphthalate (PEN) film.

Although not shown in the drawing, the base layer 21 may include a primer layer. The primer layer may help improve adhesiveness with an adjacent layer and may help control temperature transmittance.

The first light-to-heat conversion layer 22 may be formed on the base layer 21.

The first light-to-heat conversion layer 22 may absorb light in the infrared region, visible region, or ultraviolet (UV) region. The first light-to-heat conversion layer 22 may change part of the absorbed light into heat. Accordingly, it may be desirable for the first light-to-heat conversion layer 22 to include a light-to-heat conversion material 221 for absorbing light.

In an implementation, the first light-to-heat conversion layer 22 may be a metal or metal-containing layer including at least one first light-to-heat conversion material 221. The first light-to-heat conversion material 221 may include, e.g., a metal such as Al or Ag, a metal oxide, or a metal sulfide. In an implementation, the first light-to-heat conversion layer 22 may be an organic layer in a polymer form and including the first light-to-heat conversion material 221, e.g., carbon black or carbon nanotubes (CNT), a metal oxide, or a metal sulfide.

In an implementation, the metal or metal-containing layer may be formed by, e.g., a vacuum deposition method, an electron beam deposition method, or a sputtering method. In an implementation, the organic layer may be formed by, e.g., a roll coating method, a gravure method, an extrusion method, a spin coating method, or a knife coating method.

The first light-to-heat conversion layer 22 may bind the first light-to-heat conversion material 221 and may include an organic binder material that may be hardened by ultraviolet (UV) rays or heat.

The second light-to-heat conversion layer 23 may be formed on the first light-to-heat conversion layer 22. The second light-to-heat conversion layer 23 may be formed of materials described above with respect to the first light-to-heat conversion layer 22.

As described above, the first light-to-heat conversion layer 22 and the second light-to-heat conversion layer 23 may absorb light in the infrared region, visible region, or ultraviolet (UV) region, and may change part of the absorbed light into heat.

In an implementation, the first light-to-heat conversion layer 22 and the second light-to-heat conversion layer 23 may absorb light of different wavelengths.

For example, referring to FIG. 1 and FIG. 2, first laser beams (that are irradiated first) may have a relatively shorter wavelength, and most of them may pass through the first light-to-heat conversion layer 22 to then be absorbed by the second light-to-heat conversion layer 23.

Figure 8:
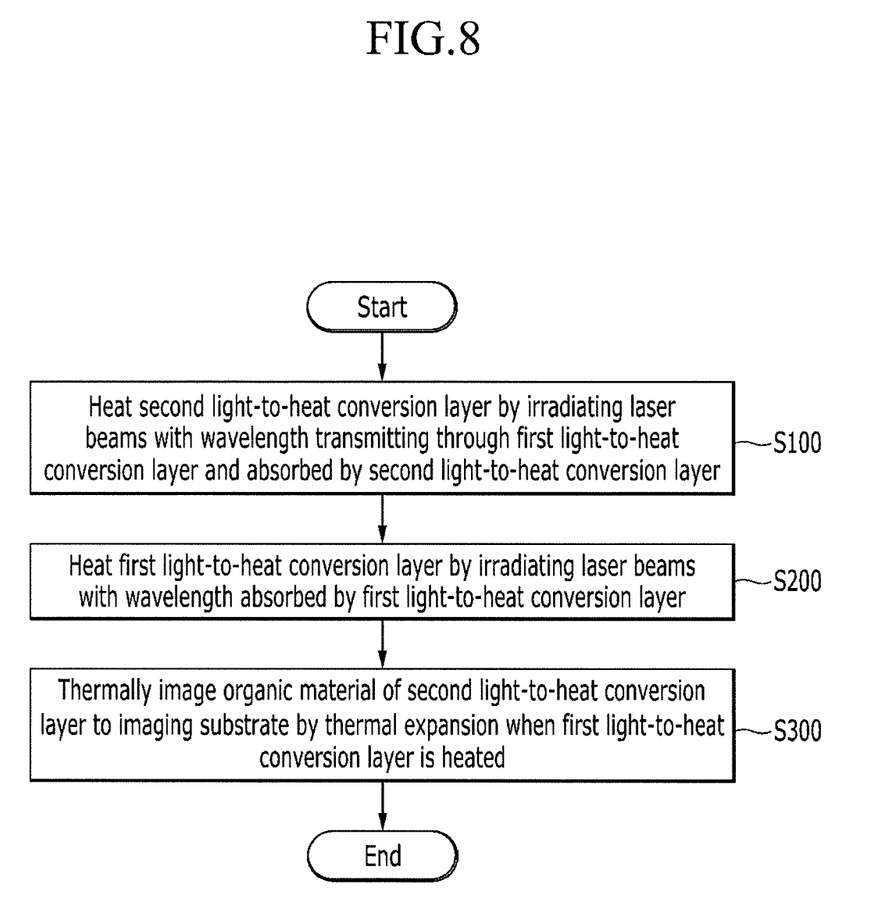
FIG. 8 illustrates a flowchart of a thermal imaging method using a donor film according to an exemplary embodiment.

Hence, light (e.g., from the first laser beams) may be changed into heat by the second light-to-heat conversion material 231 of the second light-to-heat conversion layer 23, and the second light-to-heat conversion layer 23 may be heated (see S100 of FIG. 8).

Referring to FIG. 1 and FIG. 2, the second laser beams (that are irradiated second) may have a relatively longer wavelength, and most of them may be absorbed by the first light-to-heat conversion layer 22.

For example, the light from the second laser beams absorbed by the first light-to-heat conversion layer 22 may be of a longer wavelength than light from the first laser beams absorbed by the second light-to-heat conversion layer 23.

Accordingly, light from the second laser beams may be changed into heat by the first light-to-heat conversion material 221 of the first light-to-heat conversion layer 22, and the first light-to-heat conversion layer 22 may be heated (see S200 in FIG. 8).

As noted above, light from the first laser beams (having a relatively shorter wavelength) may be absorbed by the second light-to-heat conversion layer 23, and light from the second laser beams (having a relatively longer wavelength) may be absorbed by the first light-to-heat conversion layer 22. In an implementation, it is possible to change the design so that the first laser beams may have a relatively longer wavelength and the second laser may have a relatively shorter wavelength.

A thermal imaging method using a donor film 20 according to an exemplary embodiment will now be described with reference to drawings, which show changes of respective layers of the donor film 20 when laser beams with different wavelengths are irradiated.

Figure 3:
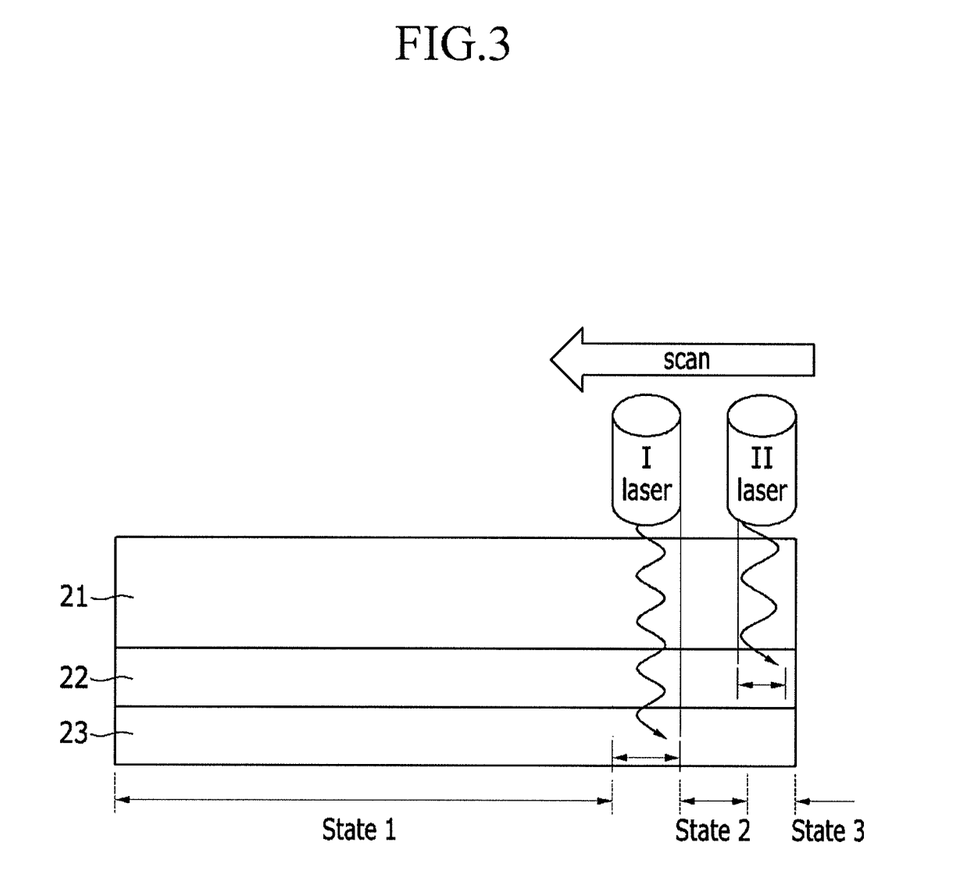
FIG. 3 illustrates sequential irradiation of laser beams with different wavelengths to the donor film of FIG. 1.
Figure 4:
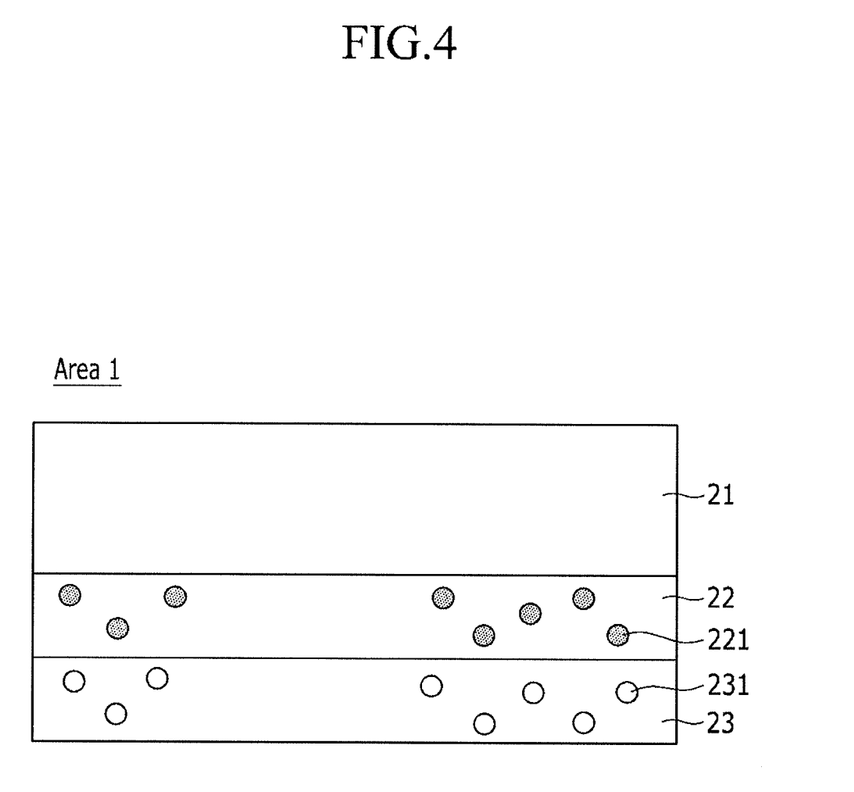
FIG. 4 illustrates a donor film in State 1 of FIG. 3.
Figure 5:
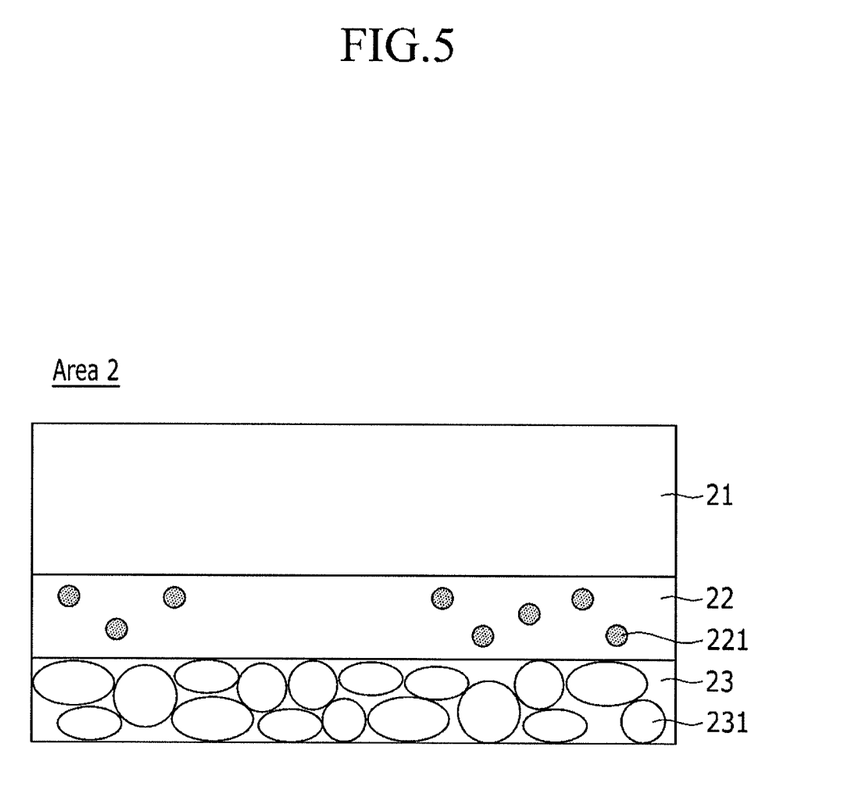
FIG. 5 illustrates a donor film in State 2 of FIG. 3.
Figure 6:
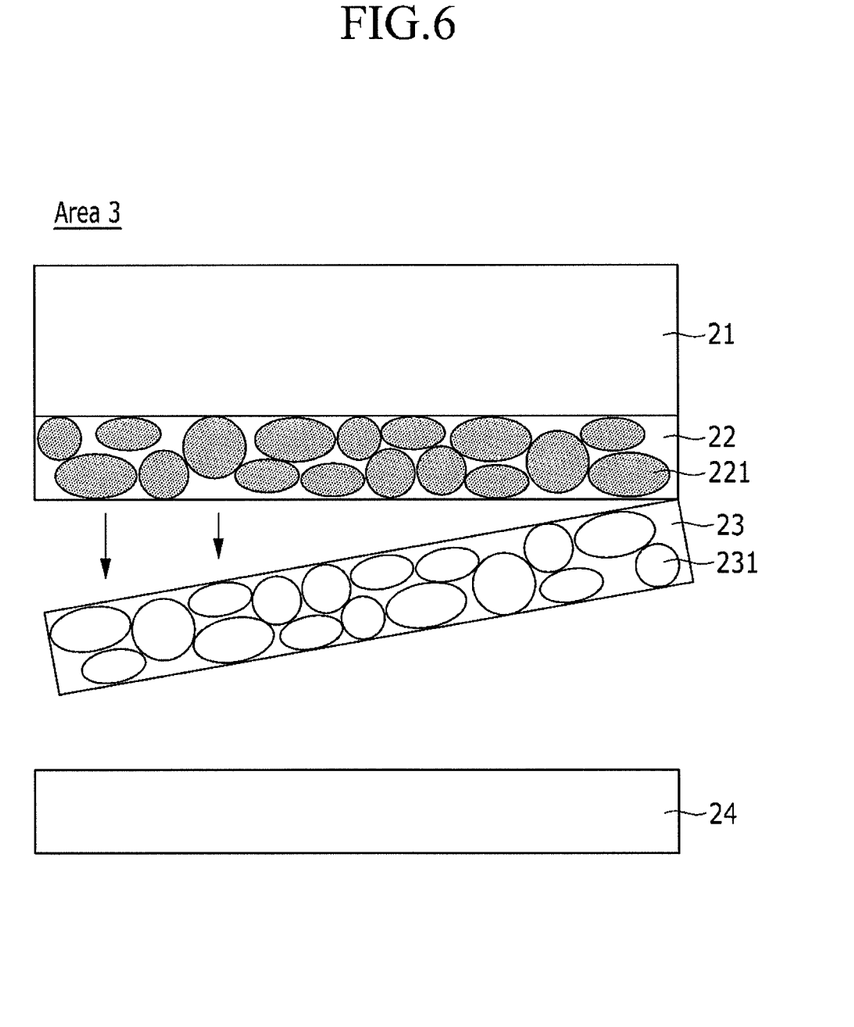
FIG. 6 illustrates a donor film in first part of State 3 of FIG. 3.
Figure 7:
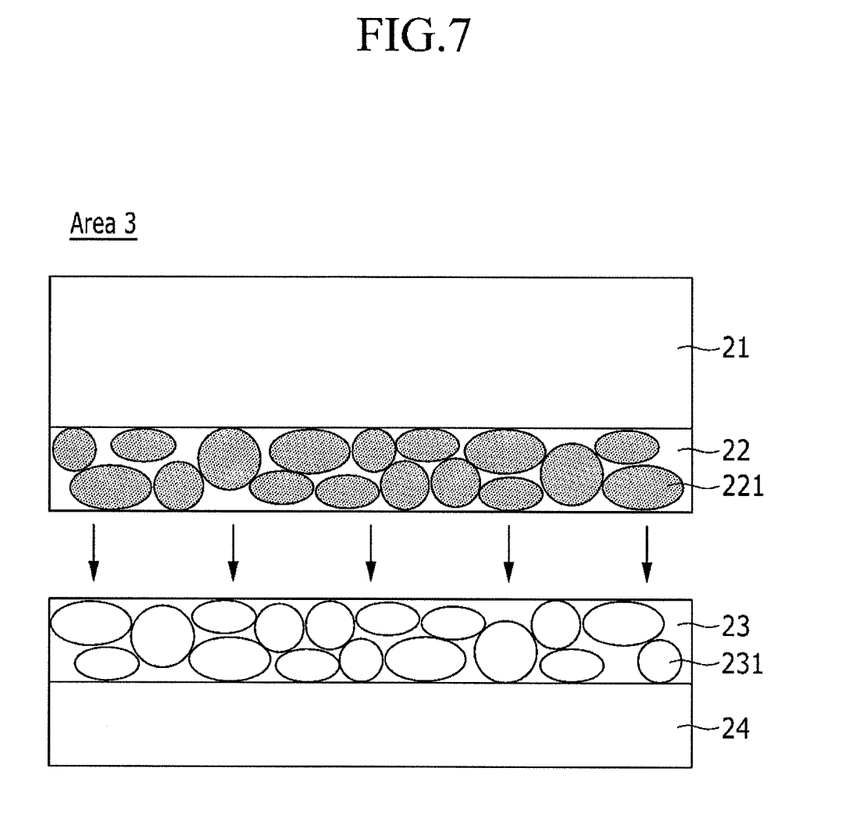
FIG. 7 illustrates a donor film in second part of State 3 of FIG. 3.

FIG. 3 illustrates sequential irradiation of laser beams with different wavelengths to a donor film 20 of FIG. 1. FIG. 4 illustrates a donor film in State 1 of FIG. 3. FIG. 5 illustrates a donor film in State 2 of FIG. 3. FIG. 6 illustrates a donor film in a first part of State 3 of FIG. 3. FIG. 7 illustrates a donor film in a second part of State 3 of FIG. 3.

Referring to FIG. 3 to FIG. 7, the first and second laser beams with different wavelengths may be sequentially irradiated on the donor film 20.

In this instance, light from the first laser beams may have a relatively shorter wavelength, and most of the light from the first laser beams may pass through the first light-to-heat conversion layer 22 to then be absorbed by the second light-to-heat conversion layer 23.

Light from the second laser beams may have a relatively longer wavelength (e.g., a wavelength longer than the wavelength of light from the first laser beams), and most of the light from the second laser beams may be absorbed by the first light-to-heat conversion layer 22.

As shown in FIG. 3, a state of the donor film 20 before the first and second laser beams are irradiated is called "State 1," a state of the donor film 20 when the first laser beams are irradiated is called "State 2," and a state of the donor film 20 when the first and second laser beams are irradiated is called "State 3."

The donor film 20 in "State 1" is shown in FIG. 4, the donor film 20 in "State 2" is shown in FIG. 5, and the donor film 20 in "State 3" is shown in FIG. 6 and FIG. 7.

Referring to FIG. 4, the first and second light-to-heat conversion materials 221 and 231 in the organic binder material may be bound on or contained within the first and second light-to-heat conversion layers 22 and 23 of the donor film 20, respectively, before the first and second laser beams are irradiated.

FIG. 4 schematically illustrates the first and second light-to-heat conversion materials 221 and 231 in the organic binder material, e.g., densities may not be accurately shown.

When the first laser beams are irradiated to the donor film 20, the first laser beams may be transmitted through the first light-to-heat conversion layer 22, and most of the light from the first laser beams may be absorbed by the second light-to-heat conversion layer 23.

The second light-to-heat conversion material 231 of the second light-to-heat conversion layer 23 (having absorbed light from the first laser beams) may change the light into heat. Thus, as shown in FIG. 5, the second light-to-heat conversion material 231 may be thermally expanded by the heat.

When the second laser beams are irradiated to the donor film 20, most of the light from the second laser beams may be absorbed by the first light-to-heat conversion layer 22.

Referring to FIG. 6, the first light-to-heat conversion material 221 of the first light-to-heat conversion layer 22 (having absorbed light from the second laser beams) may change the light into heat. Thus, the first light-to-heat conversion material 221 may be thermally expanded by the heat.

As shown in FIG. 6, the first light-to-heat conversion material 221 may be rapidly expanded by heat at a high temperature, the second light-to-heat conversion layer 23 may be pushed, and imaging power may be provided.

As shown in FIG. 7, the organic material of the second light-to-heat conversion layer 23 may be thermally imaged or transferred to an imaging substrate 24 at the bottom (see S300 of FIG. 8).

Therefore, the embodiments provide the donor film that has no interlayer (IL), thereby helping to reduce the likelihood of or preventing defects that may be caused when there is a change of physical property in the interlayer, thus allowing a roll-type process and improving the imaging width.

By way of summation and review, some donor films may include a base layer, a light-to-heat conversion (LTHC) layer, and an interlayer (IL) (made of a polymer film). A light absorption matter (pigment or dye) may absorb laser beams to image or transfer a low-molecular fluorescent organic material to an acceptor substrate.

In the hybrid patterning system (HPS) process, a physical property of the interlayer (IL) may influence an imaging characteristic. For example, when the interlayer (IL) is softened to be transformable, defects may be easily formed on a surface, and wrinkles may be generated to thereby cause a faulty product. Accordingly, it may be difficult to realize a roll-type film with a large imaging width.

The embodiments may provide a donor film for a hybrid patterning system and a thermal imaging method using the same.

The embodiments may provide a donor film that helps reduce the occurrence of wrinkles that may be generated during a process and that helps improve an imaging width.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A donor film for use in effecting thermal imaging on an imaging substrate, the donor film comprising:
   a base layer;
   a first light-to-heat conversion layer on the base layer; and
   a second light-to-heat conversion layer on the first light-to-heat conversion layer, the second light-to-heat conversion layer including an organic material for depositing on the imaging substrate,
   wherein the first light-to-heat conversion layer transmits light having a wavelength that is absorbed by the second light-to-heat conversion layer.

2. The donor film as claimed in claim 1, wherein the base layer is made of a transparent polymer film or a glass substrate.

3. The donor film as claimed in claim 1, wherein:
   the first light-to-heat conversion layer is coated on the base layer, and
   the second light-to-heat conversion layer is coated on the first light-to-heat conversion layer.

4. The donor film as claimed in claim 1, wherein the first light-to-heat conversion layer absorbs light having a shorter wavelength than light absorbed by the second light-to-heat conversion layer.

5. The donor film as claimed in claim 1, wherein the first light-to-heat conversion layer and the second light-to-heat conversion layer each independently include at least one of carbon black, carbon nanotubes (CNT), a metal oxide, or a metal sulfide.

6. A thermal imaging method, the method comprising:
   providing a donor film such that the donor film includes:
      a base layer;
      a first light-to-heat conversion layer on the base layer; and
      a second light-to-heat conversion layer on the first light-to-heat conversion layer and to which an organic material is deposited, wherein the first light-to-heat conversion layer and the second light-to-heat conversion layer respectively absorb light of different wavelengths;
   heating the second light-to-heat conversion layer by irradiating light of a wavelength that transmits through the first light-to-heat conversion layer and that is absorbed by the second light-to-heat conversion layer;
   heating the first light-to-heat conversion layer by irradiating light of a wavelength that is absorbed by the first light-to-heat conversion layer; and
   thermally imaging an organic material of the second light-to-heat conversion layer to an imaging substrate by thermal expansion when the first light-to-heat conversion layer is heated.

7. The donor film as claimed in claim 1, wherein the donor film does not include an interlayer.

* * * * *